US009954071B2

(12) United States Patent
Ding et al.

(10) Patent No.: US 9,954,071 B2
(45) Date of Patent: Apr. 24, 2018

(54) METHOD FOR PREPARING TITANIUM-ALUMINUM ALLOY THIN FILM

(71) Applicants: INSTITUTE OF MICROELECTRONICS, CHINESE ACADEMY OF SCIENCES, Beijing (CN); Jiangnan University, Wuxi, Jiangsu (CN)

(72) Inventors: Yuqiang Ding, Jiangsu (CN); Chao Zhao, Kessel-lo (BE); Jinjuan Xiang, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 18 days.

(21) Appl. No.: 15/174,720

(22) Filed: Jun. 6, 2016

(65) Prior Publication Data

US 2017/0104081 A1  Apr. 13, 2017

(30) Foreign Application Priority Data

Oct. 9, 2015 (CN) .......................... 2015 1 0648669

(51) Int. Cl.
*C23C 16/00* (2006.01)
*H01L 29/49* (2006.01)
(Continued)

(52) U.S. Cl.
CPC ...... *H01L 29/4966* (2013.01); *C23C 16/0209* (2013.01); *C23C 16/08* (2013.01); *C23C 16/18* (2013.01); *C23C 16/45527* (2013.01); *H01L 21/28088* (2013.01); *H01L 29/401* (2013.01); *H01L 29/66545* (2013.01); *H01L 29/513* (2013.01); *H01L 29/517* (2013.01)

(58) Field of Classification Search
CPC ..... C23C 16/0209; C23C 16/08; C23C 16/18; C23C 16/45527
See application file for complete search history.

(56) References Cited

U.S. PATENT DOCUMENTS

| 5,874,131 A * | 2/1999 | Vaartstra | ................. C07F 5/003 |
| | | | 257/E21.101 |
| 2008/0081772 A1* | 4/2008 | Kawata | ................ C10M 133/40 |
| | | | 508/100 |

(Continued)

*Primary Examiner* — Kelly M Gambetta
(74) *Attorney, Agent, or Firm* — Christensen, Fonder, Dardi & Herbert PLLC

(57) ABSTRACT

A method for preparing a TiAl alloy thin film, wherein a reaction chamber is provided, in which at least one substrate is placed; an aluminum precursor and a titanium precursor are introduced into the reaction chamber, wherein the aluminum precursor has a molecular structure of a structural formula (I); and the aluminum precursor and the titanium precursor are brought into contact with the substrate so that a titanium-aluminum alloy thin film is formed on the surface of the substrate by vapor deposition. The method solves the problem of poor step coverage ability and the problem of incomplete filling with regard to the small-size devices by the conventional methods. Meanwhile, the formation of titanium-aluminum alloy thin films with the aid of plasma is avoided so that the substrate is not damaged by plasma.

14 Claims, 2 Drawing Sheets

(51) Int. Cl.
*C23C 16/02* (2006.01)
*C23C 16/08* (2006.01)
*C23C 16/18* (2006.01)
*C23C 16/455* (2006.01)
*H01L 21/28* (2006.01)
*H01L 29/40* (2006.01)
*H01L 29/66* (2006.01)
*H01L 29/51* (2006.01)

(56) References Cited

U.S. PATENT DOCUMENTS

2010/0022078 A1\* 1/2010 Rockenberger .......... C09D 5/24
 438/585
2015/0004316 A1\* 1/2015 Thompson ........ C23C 16/45553
 427/253

\* cited by examiner

METHOD FOR PREPARING TITANIUM-ALUMINUM ALLOY THIN FILM

CROSS-REFERENCE TO RELATED APPLICATION

This application claims priority to a Chinese Patent Application No. 201510648669.6, filed on Oct. 9, 2015, the disclosure of which is hereby incorporated by reference herein in its entirety.

FIELD OF THE INVENTION

This disclosure relates to the field of semiconductor production, and particularly to a method for preparing a titanium-aluminum alloy thin film.

BACKGROUND OF THE INVENTION

In the past decades, integrated circuit technology has achieved remarkable developments, and the technology wherein the key size is 22 nanometers and beyond is the trend of the development of semiconductor integrated circuit technology. The gate electrode in the gate-last process does not have to endure the high-temperature annealing at about 1000° C., which is capable of improving the performance of devices by using a structure of high-k dielectric layer/metal gate, and is considered to be the mainstream process.

The gate-last process involves the problem of deposition of work function metal layers after the removal of dummy gates. At present, titanium-aluminum (TiAl) alloy thin film is a relatively commonly-used work function metal of nMOSFET. The groove formed after removing the dummy gate has the characteristic of large depth-to-width ratio. The conventional physical vapor deposition (PVD) method, bound by the drawback of poor step coverage ability of the thin film formed by this method and the presence of the phenomenon of overhang 1011 as shown in FIG. 1, has been very difficult to satisfy the application requirement for a key size less than 22 nanometers.

For the purpose of satisfying the application requirement for TiAl alloy thin films in small-size devices, i.e., to ensure good step coverage ability and filling, a best known solution is to prepare TiAl alloy thin films by using the atomic layer deposition (ALD) method. However, due to the limitation of the precursor, it is relatively difficult to obtain a TiAl alloy thin film by using the ALD method. In addition, the ALD method for growing pure metals in the prior art is typically aided with a plasma. Although plasma aids in the reaction of the precursor, it may also damage the substrate at the same time.

SUMMARY OF THE INVENTION

This present disclosure provides a method for preparing a titanium-aluminum alloy thin film to solve the problem in the prior art that it is difficult to prepare a TiAl alloy thin film which achieves a better step coverage ability without damaging the substrate.

The present disclosure provides a method for preparing a titanium-aluminum alloy thin film, comprising the steps of:
providing a reaction chamber in which at least one substrate is placed;
introducing an aluminum precursor and a titanium precursor into the reaction chamber, wherein the aluminum precursor has a molecular structure of a structural formula (I):

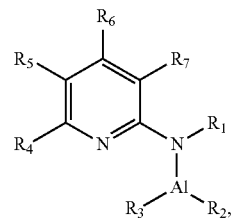

(I)

wherein, each of $R_1$, $R_2$, $R_3$, $R_4$, $R_5$, $R_6$, and $R_7$ represents a hydrogen atom, a $C_1$-$C_6$ alkyl group, a $C_2$-$C_5$ alkenyl group, a $C_3$-$C_{10}$ cycloalkyl group, a $C_6$-$C_{10}$ aryl group, —Si($R_0$)$_3$, or the groups described above substituted by a halogen atom, wherein $R_0$ is a $C_1$-$C_6$ alkyl group or a halogen-substituted $C_1$-$C_6$ alkyl group, and $R_1$, $R_2$, $R_3$, $R_4$, $R_5$, $R_6$, and $R_7$ are the same or different; and bringing the aluminum precursor and the titanium precursor into contact with the substrate so as to form a titanium-aluminum alloy thin film on the surface of the substrate by vapor deposition.

In an embodiment, the molecular structure having the structural formula (I) is obtained by degrading a molecular structure having a structural formula (II):

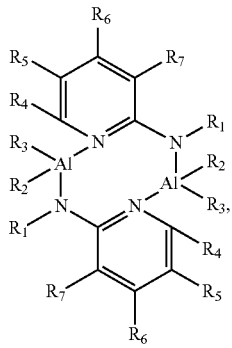

(II)

wherein, each of $R_1$, $R_2$, $R_3$, $R_4$, $R_5$, $R_6$, and $R_7$ represents a hydrogen atom, a $C_1$-$C_6$ alkyl group, a $C_2$-$C_5$ alkenyl group, a $C_3$-$C_{10}$ cycloalkyl group, a $C_6$-$C_{10}$ aryl group, —Si($R_3$)$_3$, or the groups described above substituted by a halogen atom, wherein $R_0$ is a $C_1$-$C_6$ alkyl group or a halogen-substituted $C_1$-$C_6$ alkyl group, $R_1$, $R_2$, $R_3$, $R_4$, $R_5$, $R_6$, and $R_7$ are the same or different, and the molecular structure of the structural formula (II) is formed by the complexation reaction of the molecular structure having the structural formula (I).

In an embodiment, the method further comprises the step of:
heating and degrading the molecular structure having the structural formula (II) to obtain the molecular structure having the structural formula (I).

In an embodiment, the titanium precursor comprises any one or more of titanium halide and organic titanium.

In an embodiment, the vapor deposition is atomic layer deposition ALD and/or chemical vapor deposition CVD.

In an embodiment, the ALD is a thermal-type ALD.

In an embodiment, the ALD process is performed using titanium tetrachloride as the titanium precursor, wherein:
the pressure in the chamber is in a range of 0.1-10 Torr;
the flow rate of inert gas is in a range of 50-1000 sccm;

the temperature of the substrate is in a range of 100-500° C.;

the pulse time for the aluminum precursor is in a range of 0.1 s-20 s, and the purging time is in a range of 0.1 s-20 s; and the pulse time for titanium tetrachloride is in a range of 0.1 s-20 s, and the purging time is in a range of 0.1 s-20 s.

In an embodiment, the proportion of components in the titanium-aluminum alloy thin film is adjusted by adjusting the growing temperature and the proportions of the aluminum precursor and/or the titanium precursor.

In an embodiment, the CVD process is performed using titanium tetrachloride as the titanium precursor, wherein:

the pressure in the chamber is in a range of 0.1 Torr-10 Torr;

the flow rate of inert gas is in a range of 50-1000 sccm;

the temperature of the substrate is in a range of 100-500° C.;

the flow rate of the aluminum precursor is in a range of 1-100 sccm; and the flow rate of the titanium precursor is in a range of 1-100 sccm.

Preferably, the method further comprises the step of:

subjecting the substrate to a heat treatment before introducing the aluminum precursor and the titanium precursor into the reaction chamber.

In an embodiment, a groove is provided on the substrate, wherein the groove has a depth-to-width ratio ≤10.

The present disclosure provides a method for preparing a titanium-aluminum alloy thin film, in which by using a molecular structure having structural formula (I) as an aluminum precursor, it is enabled to form a titanium-aluminum alloy thin film with a titanium precursor by a thermal-type ALD method. The problem of poor step coverage ability and the problem of incomplete filling in small-size devices by the conventional PVD are solved. Meanwhile, the formation of titanium-aluminum alloy thin films with the aid of plasma is avoided so that the substrate is not damaged by plasma and it is ensured that the performances and/or the reliability of devices are not influenced.

BRIEF DESCRIPTION OF THE DRAWINGS

In order to illustrate the technical solutions in Examples of this present application or in the prior art more clearly, the accompanying drawings required to be used in the Examples will be simply introduced below. It is apparent that the accompanying drawings described below are merely some Examples recorded in this disclosure, and other accompanying drawings may be further obtained by an ordinary skilled person in the art according to these accompanying drawings.

DETAILED DESCRIPTION OF THE INVENTION

Examples of this disclosure are described in detail below, and instances of the Examples are shown in the accompanying drawings, wherein the same or similar numerals represent the same or similar elements or elements having the same or similar functions throughout. The Examples described below with reference to the accompanying drawings are exemplary and are merely used for explaining this present disclosure, and it cannot be construed to be limitations of this disclosure.

The gate-last process for metal gate is a gate electrode replacement process, and a gate electrode of a device is formed after a source drain zone is generated. In this process, the gate electrode does not have to endure a very high annealing temperature and the influence on the gate dielectric layer is smaller. Therefore, the gate-last process may employ a high-k dielectric layer with a thickness of merely several nanometers to improve the performance of devices. As the size of the device continuously decreases, the gate-last process is more and more used to form high-performance devices, including conventional planar devices and three-dimensional devices (such as fin-type field effect transistors, or the like) and the like.

In the gate-last process for metal gate, a dummy gate and a source drain zone are first formed; the dummy gate is then removed to form a groove; thereafter, a gate electrode is reformed in the groove, and this gate electrode comprises a metal gate dielectric layer, a metal work function layer, and a metal gate electrode layer. In the process of forming the gate electrode of an nMOS, it is required to form a TiAl alloy thin film as the metal work function layer in the groove, and this metal work function layer is formed after the metal gate dielectric layer. When preparing the TiAl alloy thin film, the damage to the dielectric layer should be avoided as much as possible. Meanwhile, this TiAl alloy thin film should have a high step coverage capability and overall properties so as to improve the performance of the device.

The present disclosure proposes a method for preparing a titanium-aluminum alloy thin film, in which a special aluminum precursor is used to reduce the difficulty in forming a titanium-aluminum alloy by the reaction of an aluminum precursor and a titanium precursor in the prior art, and the aluminum precursor and the titanium precursor are allowed to be capable of forming a titanium-aluminum alloy thin film by a method of thermal-type ALD. Therefore, it avoids the problem that plasma, which contributes to the formation of a titanium-aluminum alloy from an aluminum precursor and a titanium precursor in the prior art, results in the damage to the substrate and the deterioration of the performance and the reliability of the device.

Figure 1:
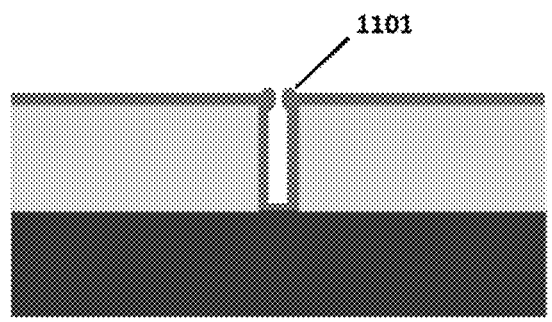
FIG. 1 is a schematic diagram of the sectional structure of a deposited thin film on the surface of a substrate having a groove with a high depth-to-width ratio by the PVD method.
Figure 2:
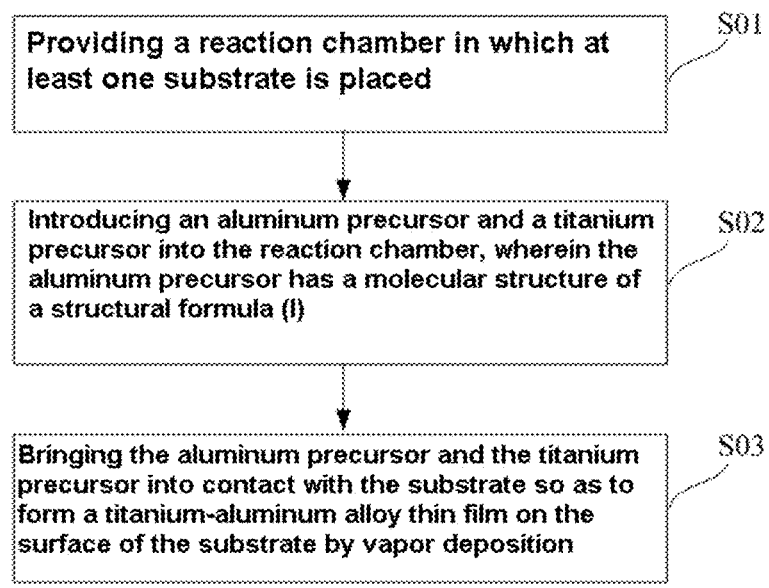
FIG. 2 is a flow chart of the method for preparing a titanium-aluminum alloy thin film according to the Examples of this disclosure.

In order to better understand the technical solution and the technical effect of this disclosure, a detailed description will be made in conjunction with a flow chart and the specific Examples. The flow chart is as shown in FIG. 2, and the processes for preparing nMOS can be referred to those shown in FIG. 3 to FIG. 5.

This method prepares a titanium-aluminum alloy thin film on a substrate having a groove structure, wherein this groove is a groove formed after removing a dummy gate and may be a groove formed after the removal of a dummy gate of a planar device or a three-dimensional device.

In this Example, a titanium-aluminum alloy thin film is prepared as a metal work function layer after a groove and a metal gate dielectric layer are formed on an nMOS planar device, and particularly, the groove is formed by the following steps:

First, a substrate 100 is provided, and the substrate 100 is a semiconductor substrate, and may be a Si substrate, a Ge substrate, a SiGe substrate, an SOI (Silicon On Insulator) or a GOI (Germanium On Insulator), or the like. In other Examples, the semiconductor substrate may also be a substrate comprising other element semiconductors or compound semiconductors, for example GaAs, InP or SiC, or the like, may also be a laminated structure, for example Si/SiGe, or the like, and may also be other epitaxial structures, for example SGOI (Germanium Silicon on Insulator), or the like. In this Example, the substrate 100 is a bulk silicon substrate, and a separator 101 and a groove 102 are formed on the substrate 100, with reference to that shown in FIG. 3.

The separator 101 separates channels of the device, and may be silicon oxide in this Example.

First, etching is performed on the semiconductor substrate 100 to form a separation groove; and it may particularly comprise: a nitride thin film (not shown in the figure) is deposited as a mask layer and a chemical mechanical polishing (CMP) stopping layer; then a lithography process is performed thereon, and the position of the separation groove is defined; and next, a dry etching may be used to perform separation groove etching on the bulk silicon substrate to form the separation groove.

Thereafter, oxide filling of the separation groove is performed; in particular, $SiO_2$ may be deposited by the chemical vapor deposition (CVD) method to complete the filling of the separation groove.

Next, a CMP process is performed to remove the redundant filling layer to form a separator 101; for example, the redundant filling layer is removed by a CMP process which stops on the nitride thin film of the CMP stopping layer, and the nitride thin film is removed.

Thereafter, a dummy gate oxide layer and a polycrystalline silicon layer (not shown in the figure) are deposited; for example, a layer of $SiO_2$ is first deposited as a gate oxide layer, and a polycrystalline silicon layer is then deposited by a low-pressure chemical vapor deposition apparatus.

Next, etching is performed on the gate oxide layer and the polycrystalline silicon layer to form a dummy gate (not shown in the figure); for example, the position of a dummy gate is defined by a lithography process, and then a dry etching process is used to remove the dummy gate layer and the gate oxide layer, which are redundant.

Thereafter, ion injection is performed to form a source electrode and a drain electrode; for example, n-type and p-type lightly doped drain injections are first performed, a side wall is then formed by depositing $SiO_2$ and performing dry etching, and next, n+ type and p+ type source/drain heavy dopings are performed to form a source electrode and a drain electrode.

Next, an interlayer dielectric layer (ILD) 103 is deposited and formed on the substrate 100; for example, methods such as CVD, PVD, or the like may be used to deposit undoped silicon oxide ($SiO_2$), doped silicon oxide (such as borosilicate glass, borophosphosilicate glass, or the like) and silicon nitride ($Si_3N_4$) or other low-k dielectric materials, or the like, and planarization is performed by a CMP process to form the interlayer dielectric layer 103.

Thereafter, the dummy gate and the dummy gate oxide layer are removed to form a groove 102.

Figure 3:
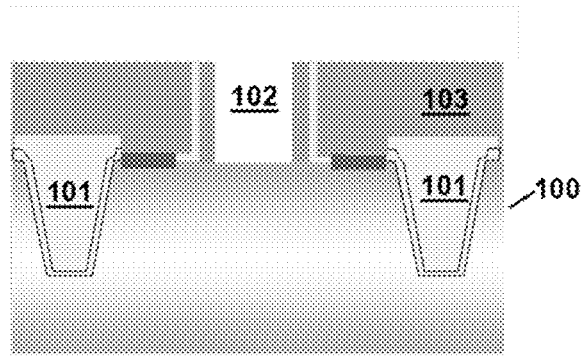
FIG. 3 is a schematic diagram of the sectional structure of a device formed with a groove after removing a dummy gate in the prior art.

So far, the substrate 100 formed with the separator 101 and the groove 102 of the Example of this disclosure has been formed, as shown in FIG. 3.

After the groove 102 is formed, an interface oxide layer 204, a metal gate dielectric layer 205, and a metal diffusion barrier layer 206 are then formed, as shown in FIG. 3. An interface oxide layer 204 is first formed, and is typically formed by oxidation using $O_3$; a high-k dielectric thin film is then deposited, and is used as a metal gate dielectric layer 205, for example, a $HfO_2$ thin film deposited by the ALD method; in addition, it is also possible to first deposit a metal barrier layer thin film 206 in order to prevent titanium-aluminum from diffusing into the ILD before the titanium-aluminum alloy thin film is formed, and a TiN thin film deposited by the ALD method is typically used as the metal diffusion barrier layer. At this time, the depth-to-width ratio of the groove 102 is larger, and the conventional PVD method is not capable of preparing a titanium-aluminum alloy thin film with a good step covering ratio.

Example 1

Figure 4:
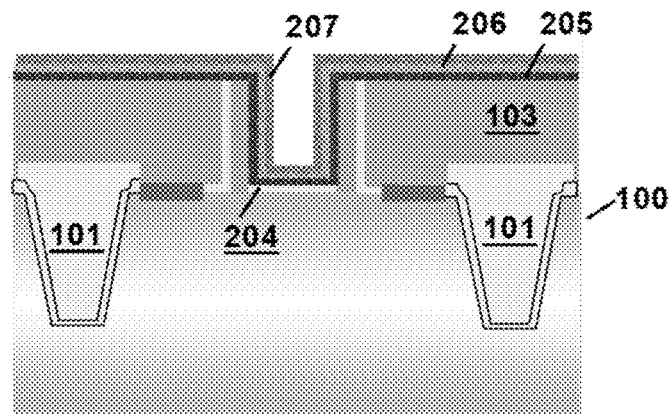
FIG. 4 is a schematic diagram of the sectional structure of a device with a TiAl alloy thin film deposited on the surface according to the Examples of this disclosure.

In this Example, the aluminum precursor is a molecular structure having structural formula (I), the titanium precursor is titanium tetrachloride, and a titanium-aluminum alloy thin film is prepared as a work function metal layer 207 of an nMOS transistor by a thermal-type ALD method, with reference to that shown in FIG. 4, and this method comprises the steps of:

Step S01, providing a reaction chamber, in which at least one substrate is placed.

In this Example, the reaction chamber is an enclosed chamber, and this chamber is required to maintain a certain degree of vacuum and has at least two gas paths and the corresponding gas flowmeters, or the like, in order to introduce different reaction gases (e.g., precursors, or the like) into the chamber. The substrate is a bulk silicon substrate, and structures of the device are formed on the substrate, as described above.

Step S02, introducing an aluminum precursor and a titanium precursor into the reaction chamber, wherein the aluminum precursor has a molecular structure of structural formula (I):

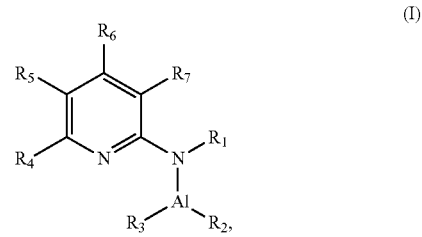

wherein, each of $R_1$, $R_2$, $R_3$, $R_4$, $R_5$, $R_6$, and $R_7$ represents a hydrogen atom, a $C_1$-$C_6$ alkyl group, a $C_2$-$C_5$ alkenyl group, a $C_3$-$C_{10}$ cycloalkyl group, a $C_6$-$C_{10}$ aryl group, —$Si(R_0)_3$, or the groups described above substituted by a halogen atom, wherein $R_0$ is a $C_1$-$C_6$ alkyl group or a halogen-substituted $C_1$-$C_6$ alkyl group, and $R_1$, $R_2$, $R_3$, $R_4$, $R_5$, $R_6$, and $R_7$ are the same or different.

In this Example, the titanium precursor may be titanium halide, organic titanium, or the like, for example, titanium tetrachloride, titanium tetrafluoride, tetramethylamino titanium, trimethylamino titanium, dimethylamino titanium, or the like, wherein process conditions are as shown below:

the pressure in the chamber is in a range of 0.1-10 Torr;
the flow rate of inert gas is in a range of 50-1000 sccm;
the temperature of the substrate is in a range of 100-500° C.;
the pulse time of the aluminum precursor is in a range of 0.1 s-20 s, and the purging time is in a range of 0.1 s-20 s; and
the pulse time of titanium tetrachloride is in a range of 0.1 s-20 s, and the purging time is in a range of 0.1 s-20 s.

In a specific Example, the titanium precursor is titanium tetrachloride, and process conditions are as follows:

the pressure of the chamber is 1.2 Torr;
the flow rate of inert gas is 800 sccm;
the pulse time for the aluminum precursor is 0.2 s;
the pulse time for titanium tetrachloride is 0.15 s.

Herein, the inert gas includes but is not limited to helium gas, nitrogen gas, and argon gas.

Step S03, bringing the aluminum precursor and the titanium precursor into contact with the substrate so as to form a titanium-aluminum alloy thin film on the surface of the substrate by the vapor deposition method.

In this Example, the vapor deposition is atomic layer deposition ALD and/or chemical vapor deposition CVD, wherein the ALD method comprises: a thermal-type ALD method, a plasma enhanced ALD method, or the like, and the CVD method comprises: a thermal-type CVD method, a plasma enhanced CVD (PECVD) method, or the like. Since a special aluminum precursor is used, a titanium-aluminum alloy thin film may be formed by a thermal reaction. For example, in order to avoid damage from plasma to the base, a titanium-aluminum alloy thin film may be formed by a thermal-type ALD method, wherein the temperature of the substrate is in a range of 100-500° C.

In a specific Example, a titanium-aluminum alloy thin film is formed by using a thermal-type ALD method, and in this process, the temperature of the substrate is 400° C.; for example, a titanium-aluminum alloy thin film is formed on the substrate 100 from an aluminum precursor of structural formula (I) and titanium tetrachloride by a thermal-type ALD method. Using the process conditions in this Example, it is possible to form a high-quality titanium-aluminum alloy thin film with a titanium-to-aluminum component ratio of 1:2 at a lower temperature with a higher deposition rate, and damage to the high-k dielectric layer will not occur.

It is to be indicated that the ALD processes for growing pure metals in the prior art are typically aided with plasma. Although this plasma aids in the reaction of the precursor, it may also damage the substrate at the same time. For example, in a process of preparing a high-k metal gate, after a hafnium oxide thin film with a thickness of about 2 nanometers is formed, if a plasma ALD method is used to prepare a titanium-aluminum alloy thin film, this plasma simultaneously and/or first acts on the hafnium oxide thin film, and may result in damage to partial areas of the hafnium oxide thin film, which will affect the performance and/or the reliability of the device. By using a special aluminum precursor, the method for preparing a titanium-aluminum alloy thin film provided by the disclosure allows that the titanium-aluminum alloy thin film, which can be prepared only if aiding with plasma in the prior art, may be prepared merely by a thermal reaction. Therefore, damage from plasma to the base is avoided, and the performance and/or the reliability of the device are improved.

In addition, the proportions of components in the finally formed titanium-aluminum alloy thin film may be adjusted by adjusting the growing temperature and the proportions of the aluminum precursor and/or the titanium precursor, for example the flow rate proportions. In practical use, with respect to the ALD method, the adjustment of the proportions of the aluminum precursor and/or the titanium precursor may be particularly achieved by adjusting pulse cycles and/or the pulse time, or the like, in order to form titanium-aluminum alloy thin films with different proportions of components.

Of course, the titanium-aluminum alloy thin film prepared by the method provided by the disclosure is not only limited to the metal work function layer 207 of the metal gate, but may also be used in other devices, particularly in applications of surface deposition and/or groove filling for small-size devices, which are not specifically defined herein. In this disclosure, the depth-to-width ratio of the groove should be ≤10 to prepare a titanium-aluminum alloy thin film with a good step covering ratio.

Figure 5:
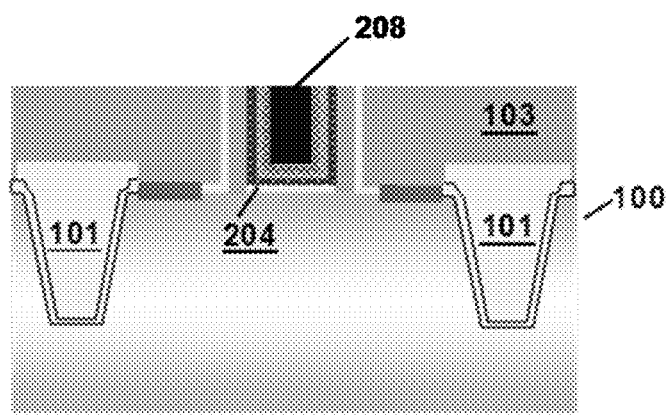
FIG. 5 is a schematic diagram of the sectional structure of an nMOS transistor prepared according to the Examples of this disclosure.

In practical use, it is further required to form a metal gate electrode layer 208 to complete the preparation of an nMOS transistor. Particularly, with respect to the NMOS transistor, metals which may be used for the metal gate electrode layer 208 include but are not limited to hafnium, zirconium, titanium, tantalum, aluminum, alloys of these metals, and carbides of these metals such as hafnium carbide, zirconium carbide, titanium carbide, tantalum carbide, and aluminum carbide, or the like, and the metal layer described above is formed by an ALD method or a CVD method, or the like; next, redundant metals are removed by a planarization process such as CMP, or the like, to form a metal gate electrode layer 208, as shown in FIG. 5.

Example 2

This example provides a method for preparing a titanium-aluminum alloy thin film which is the same as that described in Example 1, except that, in this Example, obtaining the molecular structure having the structural formula (I) by degrading a molecular structure having structural formula (II); performing a heat treatment on the substrate before introducing an aluminum precursor and a titanium precursor into the reaction chamber; and heating and degrading the molecular structure having the structural formula (II) to obtain the having the structural formula (I).

Step S11 is the same as step S01 in Example 1 and is not described in detail hereby.

Step S12, introducing an aluminum precursor and a titanium precursor into the reaction chamber, wherein the aluminum precursor has a molecular structure of structural formula (II):

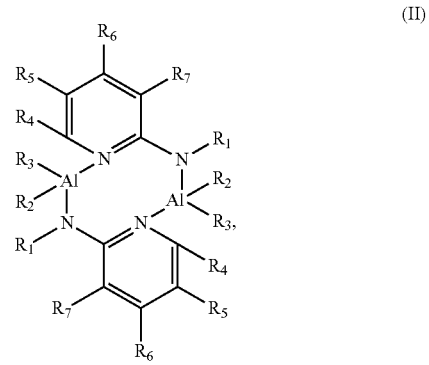

wherein, each of $R_1$, $R_2$, $R_3$, $R_4$, $R_5$, $R_6$, and $R_7$ represents a hydrogen atom, a $C_1$-$C_6$ alkyl group, a $C_2$-$C_5$ alkenyl group, a $C_3$-$C_{10}$ cycloalkyl group, a $C_6$-$C_{10}$ aryl group, —Si($R_0$)$_3$, or the groups described above substituted by a halogen atom, wherein $R_0$ is a $C_1$-$C_6$ alkyl group or a halogen-substituted $C_1$-$C_6$ alkyl group, $R_1$, $R_2$, $R_3$, $R_4$, $R_5$, $R_6$, and $R_7$ are the same or different, and the molecular structure of the structural formula (II) is formed by the complexation reaction of the molecular structure having the structural formula (I).

In this Example, the molecular structure of the structural formula (II) is formed by the complexation reaction of the aluminum precursor in Example 1. The molecular structure formed by complexation has better stability and facilitates storage and transportation in practical applications. The molecular structure of this structural formula (II) will is spontaneously degraded into a molecular structure of structural formula (I) at a certain temperature, for example 150° C. In practical use, both the molecular structure of structural formula (I) and the molecular structure of structural formula (II) may be used as an aluminum precursor, which may form a titanium-aluminum alloy thin film with a titanium precursor by vapor deposition, and it is not specifically defined herein. Of course, in order to improve the volatility of the aluminum precursor, the molecular structure of structural formula (I) is preferably used as the aluminum precursor.

In practical use, in order to improve the mechanical properties of the titanium-aluminum alloy thin film prepared, for example, the adhesion between the thin film and the substrate, the substrate is subject to a heat treatment before the aluminum precursor and the titanium precursor are introduced into the reaction chamber.

In a specific Example, the substrate in the reaction chamber is first subjected to a heating process, which may be at 200° C. for 90 S, and then the temperature of the chamber is reduced to a set value. At the same time, the molecular structure of structural formula (II) is subject to heating and is degraded into the molecular structure of structural formula (I), the molecular structure of structural formula (I) and the titanium precursor are introduced into the reaction chamber for reaction. The particular process conditions are the same as those in Example 1 and are not described in detail hereby.

Step S13 is the same as step S03 in Example 1 and is not described in detail hereby.

The method for preparing a titanium-aluminum alloy thin film provided by the Example of this disclosure degrades the molecular structure of structural formula (II) into the molecular structure having structural formula (I) as an aluminum precursor. The molecular structure of structural formula (II) has better thermal stability and facilitates storage and transportation. In use, it is degraded into the molecular structure of structural formula (I) having better volatility by heating so as to form a titanium-aluminum alloy thin film by vapor deposition.

Example 3

This example provides a method for preparing a titanium-aluminum alloy thin film which is the same as that described in Example 1, except that the surface on the substrate in this Example is not highly sensitive to plasma damage; the titanium-aluminum alloy thin film is deposited using a plasma enhanced CVD method; and the temperature of the substrate is 200° C.

Step S01, providing a reaction chamber, in which at least one substrate is placed.

In this Example, the substrate is a germanium substrate, a gallium-arsenic substrate, or the like, used for preparing devices with high carrier mobility.

Step S02, introducing an aluminum precursor and a titanium precursor into the reaction chamber, wherein the aluminum precursor has a molecular structure of structural formula (I):

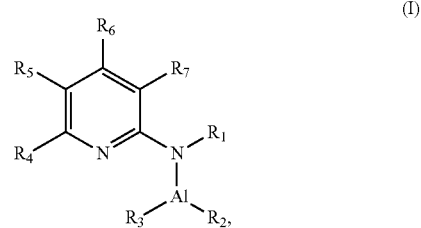

wherein, each of $R_1$, $R_2$, $R_3$, $R_4$, $R_5$, $R_6$, and $R_7$ represents a hydrogen atom, a $C_1$-$C_6$ alkyl group, a $C_2$-$C_5$ alkenyl group, a $C_3$-$C_{10}$ cycloalkyl group, a $C_6$-$C_{10}$ aryl group, —Si($R_0$)$_3$, or the groups described above substituted by a halogen atom, wherein $R_0$ is a $C_1$-$C_6$ alkyl group or a halogen-substituted $C_1$-$C_6$ alkyl group, and $R_1$, $R_2$, $R_3$, $R_4$, $R_5$, $R_6$, and $R_7$ are the same or different.

In this Example, the titanium precursor is titanium halide, organic titanium, or the like, and a titanium-aluminum thin film is prepared by a chemical vapor deposition method at a low temperature to prevent the previously formed devices from being damaged by high temperature.

Herein, process conditions are as shown below:
the pressure in the chamber is in a range of 0.1 Torr-10 Torr;
the flow rate of inert gas is in a range of 50-1000 sccm;
the temperature of the substrate is in a range of 100-500° C.;
the flow rate of the aluminum precursor is in a range of 1-100 sccm;
the flow rate of the titanium precursor is in a range of 1-100 sccm.

In a specific Example, the titanium precursor is titanium tetrachloride, and process conditions are:
the pressure of in chamber is 1.5 Torr;
the flow rate of inert gas is 600 sccm;
the temperature of the substrate is 200° C.;
the flow rate of the aluminum precursor is 10 sccm;
the flow rate of the titanium precursor is 10 sccm.

Herein, the inert gas includes but is not limited to helium gas, nitrogen gas, and argon gas.

Step S03, bringing the aluminum precursor and the titanium precursor into contact with the substrate so as to form a titanium-aluminum alloy thin film on the surface of the substrate by the vapor deposition method.

In this Example, the vapor deposition is a plasma chemical vapor deposition CVD. Since a plasma-assisted technology is used, a titanium-aluminum thin film may be rapidly deposited at a lower temperature.

In addition, the proportions of components in the finally formed titanium-aluminum alloy thin film may be adjusted by adjusting the proportions of the aluminum precursor and/or the titanium precursor, for example flow rate proportions.

Although the present disclosure has been preferably disclosed as above, it not intended to define this present disclosure. Without departing from the scope of the technical solutions of this present disclosure, any person skilled in the art may exert many possible variations and modifications, or amendments to equivalent Examples with equivalent changes on the technical solutions of this present disclosure using the methods and technical contents disclosed above. Therefore, all contents which do not depart from the technical solutions of this present disclosure, all simple amendments exerted on the above Examples according to the technical substance of this disclosure, and equivalent changes and modifications are still within the scope of the technical solutions of this present disclosure.

What is claimed is:

1. A method for preparing a titanium-aluminum alloy thin film, comprising the steps of:
   providing a reaction chamber in which at least one substrate is placed;
   introducing an aluminum precursor and a titanium precursor into the reaction chamber, wherein the aluminum precursor has a molecular structure of a structural formula (I) and is obtained by degrading a molecular structure having a structural formula (II):

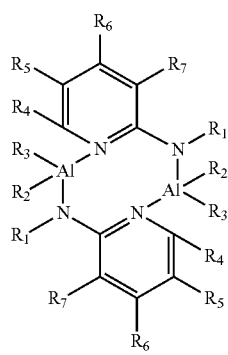

(II)

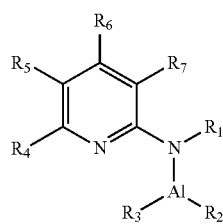

(I)

wherein, each of $R_1$, $R_2$, $R_3$, $R_4$, $R_5$, $R_6$, and $R_7$ represents a hydrogen atom, a $C_1$-$C_6$ alkyl group, a $C_2$-$C_5$ alkenyl group, a $C_3$-$C_{10}$ cycloalkyl group, a $C_6$-$C_{10}$ aryl group, —Si($R_0$)$_3$, or the groups described above substituted by a halogen atom, wherein $R_0$ is a $C_1$-$C_6$ alkyl group or a halogen-substituted $C_1$-$C_6$ alkyl group, and $R_1$, $R_2$, $R_3$, $R_4$, $R_5$, $R_6$, and $R_7$ are the same or different, and the molecular structure of the structural formula (II) is formed by the complexation reaction of the molecular structure having the structural formula (I); and
   bringing the aluminum precursor and the titanium precursor into contact with the substrate so as to form a titanium-aluminum alloy thin film on the surface of the substrate by vapor deposition.

2. The method according to claim 1, wherein the method further comprises the step of:
   heating and degrading the molecular structure having the structural formula (II) to obtain the molecular structure having the structural formula (I).

3. The method according to claim 1, wherein the titanium precursor comprises any one or more of titanium halide and organic titanium.

4. The method according to claim 2, wherein the titanium precursor comprises any one or more of titanium halide and organic titanium.

5. The method according to claim 1, wherein the vapor deposition is atomic layer deposition ALD and/or chemical vapor deposition CVD.

6. The method according to claim 2, wherein the vapor deposition is atomic layer deposition ALD and/or chemical vapor deposition CVD.

7. The method according to claim 5, wherein the ALD is a thermal-type ALD.

8. The method according to claim 7, wherein the ALD process is performed using titanium tetrachloride as the titanium precursor, wherein:
   the pressure in the chamber is in a range of 0.1-10 Torr;
   the flow rate of inert gas is in a range of 50-1000 sccm;
   the temperature of the substrate is in a range of 100-500° C.;
   the pulse time of the aluminum precursor is in a range of 0.1 s-20 s, and the purging time is in a range of 0.1 s-20 s; and
   the pulse time of titanium tetrachloride is in a range of 0.1 s-20 s, and the purging time is in a range of 0.1 s-20 s.

9. The method according to claim 8, wherein the proportion of components in the titanium-aluminum alloy thin film is adjusted by adjusting the growing temperature and the proportions of the aluminum precursor and/or the titanium precursor.

10. The method according to claim 5, wherein the CVD process is performed using titanium tetrachloride as the titanium precursor, wherein:
    the pressure in the chamber is in a range of 0.1 Torr-10 Torr;
    the flow rate of inert gas is in a range of 50-1000 sccm;
    the temperature of the substrate is in a range of 100–500° C.;
    the flow rate of the aluminum precursor is in a range of 1-100 sccm; and
    the flow rate of the titanium precursor is in a range of 1-100 sccm.

11. The method according to claim 1, wherein the method further comprises the step of:
    subjecting the substrate to a heat treatment before introducing the aluminum precursor and the titanium precursor into the reaction chamber.

12. The method according to claim 2, wherein the method further comprises the step of:
    subjecting the substrate to a heat treatment before introducing the aluminum precursor and the titanium precursor into the reaction chamber.

13. The method according to claim 1, wherein a groove is provided on the substrate, wherein the groove has a depth-to-width ratio ≤10.

14. The method according to claim 2, wherein a groove is provided on the substrate, wherein the groove has a depth-to-width ratio ≤10.

* * * * *